(12) United States Patent
Determan et al.

(10) Patent No.: US 7,391,346 B1
(45) Date of Patent: Jun. 24, 2008

(54) SWITCHING AMPLIFIER SYSTEM AND METHOD

(75) Inventors: Michael Determan, Brighton, MA (US); Kamlesh Khilnani, Hudson, MA (US)

(73) Assignee: Sigmatel, Inc., Austin, TX (US)

( * ) Notice: Subject to any disclaimer, the term of this patent is extended or adjusted under 35 U.S.C. 154(b) by 24 days.

(21) Appl. No.: 11/702,269

(22) Filed: Feb. 5, 2007

(51) Int. Cl.
*H03M 5/08* (2006.01)
*H03M 1/82* (2006.01)
*H03K 9/08* (2006.01)

(52) U.S. Cl. .......... 341/53; 341/152; 375/238; 330/10

(58) Field of Classification Search .......... 341/53, 341/76, 77, 152; 375/238; 330/10
See application file for complete search history.

(56) References Cited

U.S. PATENT DOCUMENTS

| | | | |
|---|---|---|---|
| 5,077,539 A | 12/1991 | Howatt | |
| 5,425,061 A * | 6/1995 | Laczko et al. | 375/371 |
| 5,617,058 A | 4/1997 | Adrian et al. | |
| 6,498,531 B1 | 12/2002 | Ulrick et al. | |
| 6,552,607 B1 | 4/2003 | Danielson | |
| 6,853,325 B2 * | 2/2005 | Arizumi et al. | 341/152 |
| 7,286,009 B2 * | 10/2007 | Andersen et al. | 330/10 |
| 7,327,296 B1 * | 2/2008 | Gaboriau et al. | 341/143 |
| 2006/0247810 A1 * | 11/2006 | Risbo et al. | 700/94 |

* cited by examiner

*Primary Examiner*—Howard Williams
(74) *Attorney, Agent, or Firm*—Toler Law Group, Intellectual Properties (57) ABSTRACT

A switching amplifier system and method is disclosed. In a particular embodiment, a pulse width modulation frame size is determined based on a sample rate of a digital input signal. Data associated with the first digital input signal is modified based on the pulse width modulation frame size. A pulse width modulation signal is generated in response to the modified data.

28 Claims, 5 Drawing Sheets

SWITCHING AMPLIFIER SYSTEM AND METHOD

FIELD OF THE DISCLOSURE

The present disclosure is generally related to switching amplifier systems and methods.

BACKGROUND

Switching amplifiers are often used to provide for high efficiency operation. Certain integrated circuit components used to implement switching amplifiers, such as sample rate converters, may utilize more area on a silicon device than desired. Accordingly, there is a need for integrated circuit components for use in switching amplifier designs that utilize less area.

DETAILED DESCRIPTION OF THE DRAWINGS

In a particular embodiment, a switching amplifier system is disclosed that includes a sample rate detection module to detect a sample rate of a digital input signal. The system also includes a frame size module to determine a pulse width modulation frame size based on the sample rate of the digital input signal. The system includes an upsampling module to modify data associated with the digital input signal to produce an upsampled digital input signal. The system includes a noise shaper module to modify the upsampled digital input signal based on the pulse width modulation frame size to produce a noise shaper output signal. The system also includes a pulse width modulation device responsive to the noise shaper output signal.

In another embodiment, a digital signal processing device for use in connection with a switching amplifier system is disclosed. The device includes a first summing unit that is responsive to a digital input signal. The device also includes a multiplier stage that is responsive to the first summing unit and to a pulse width modulation frame size data. The multiplier stage has an output to provide a noise shaper output signal.

In another embodiment, a method for processing a digital signal is disclosed. The method includes detecting a first sample rate of a first digital input signal. The method includes determining a first pulse width modulation frame size based on the first sample rate. The method includes modifying data associated with the first digital input signal based on the first pulse width modulation frame size. The method further includes generating a first pulse width modulation signal in response to the modified data.

In another embodiment, a method for processing a digital signal is disclosed. The method includes performing an addition operation on a digital input signal and a feedback stage signal to produce an addition operation output signal. The method includes performing a multiplication operation on the addition operation output signal and pulse width modulation frame size data to produce a first multiplication operation output signal. The method further includes modifying the first multiplication operation output signal according to the pulse width modulation frame size data to produce a noise shaper output signal.

In another embodiment, a method for processing a digital signal is disclosed. The method includes detecting a sample rate of a digital input signal and determining a pulse width modulation frame size based on the sample rate. The method includes generating a pulse width modulation signal based on the pulse width modulation frame size. Generating the pulse width modulation signal includes performing a compensation operation.

Figure 1:
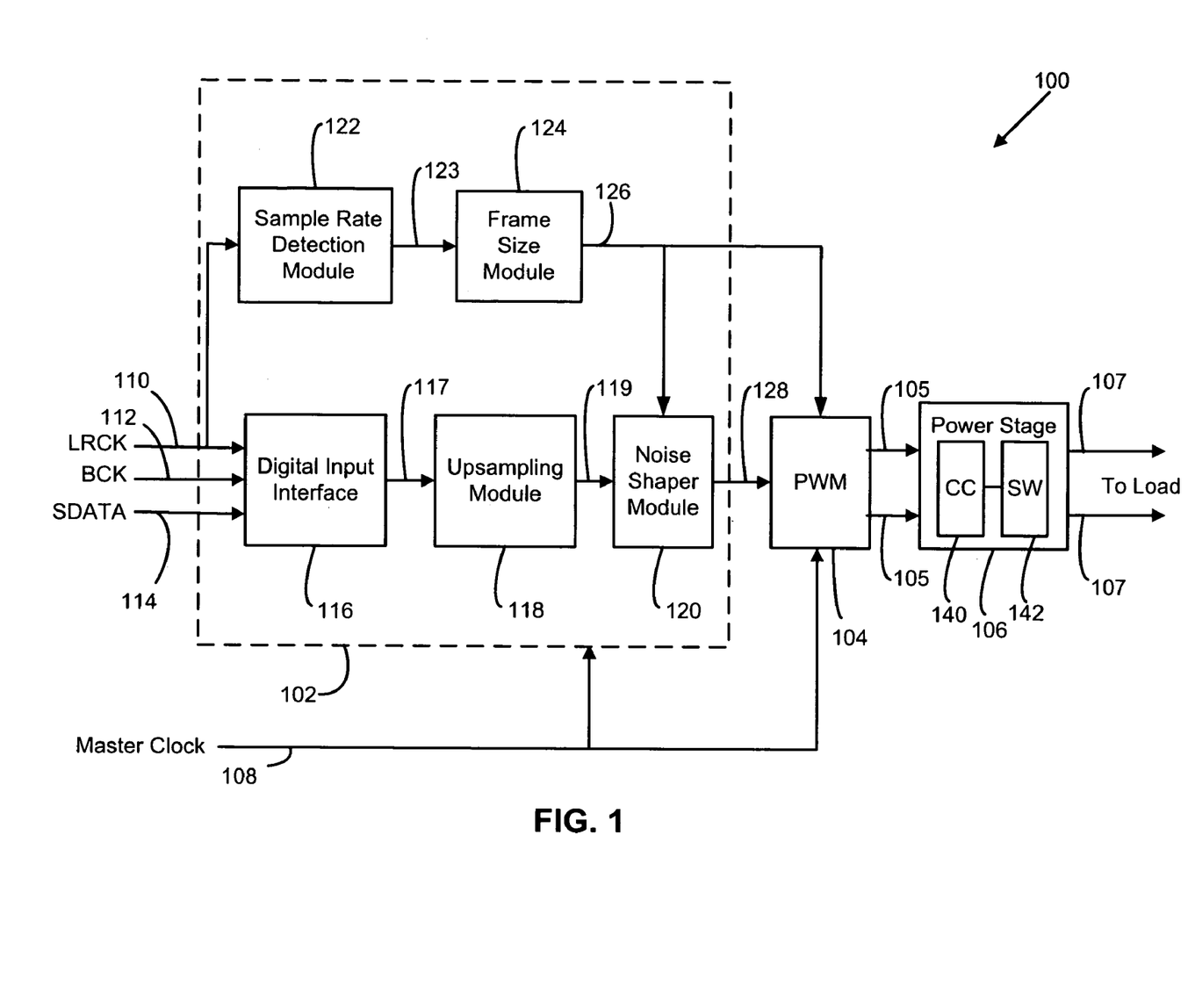
FIG. 1 is a block diagram of a particular illustrative embodiment of a switching amplifier system.

Referring to FIG. 1, a particular illustrative embodiment of a switching amplifier system is depicted and generally designated 100. The system 100 includes a digital signal processor 102 coupled to a pulse width modulation device (PWM) 104. The PWM 104 is coupled to a power stage 106. The digital signal processor 102 and the PWM 104 are coupled to receive a master clock signal input 108. The digital signal device is also coupled to receive a frame clock signal (LRCK) input 110, a bit clock signal (BCK) input 112, and a digital input signal (SDATA) input 114. In a particular embodiment, the power stage 106 may provide an output 107 to a drive a load. In a specific embodiment, the output 107 may be coupled to an audio speaker.

The digital signal processor 102 includes a digital input interface 116 that is coupled to receive the frame clock signal 110, the bit clock signal 112, and the digital input signal 114. An upsampling module 118 is coupled to the digital input interface 116 and is further coupled to a noise shaper module 120. A sample rate detection module 122 is coupled to receive the frame clock signal 110 and is further coupled to a frame size module 124. The frame size module 124 is coupled to provide a frame size signal output 126 to the noise shaper module 120 and to the PWM 104. The noise shaper module 120 is coupled to provide a noise shaped signal output 128 to the PWM 104.

During operation, the digital signal processor 102 receives the frame clock signal 110, the bit clock signal input 112, and the digital input signal 114 at the digital input interface 116. In a particular embodiment, the digital input signal 114 may be a digital audio signal. In a specific embodiment, the digital input signal 114 may include data from a compact disc (CD), digital audio tape (DAT), or any other form of digital audio media. The digital input interface 116 may provide an interface signal output 117 to the upsampling module 118 that includes the digital input signal 114.

In a particular embodiment, a pulse width modulation frame size is computed to accommodate for a difference between a sample rate of the digital input signal 114 and the master clock 108. The sample rate detection module 122 may receive the frame clock signal 110 and detect the sample rate of the digital input signal 114. The sample rate detection module 122 may send a sample rate signal output 123 indicating the detected sample rate to the frame size module 124. The frame size module 124 may determine a pulse width modulation frame size based on the sample rate signal 123 and may provide the frame size signal output 126 to the noise shaper module 120 and PWM 104.

In a particular embodiment, the upsampling module 118 may modify data associated with digital input signal 114 to generate an upsampled digital signal 119. In a particular embodiment, the upsampling module 118 may include an interpolation filter. In a specific embodiment, the interpolation filter may be a finite impulse response (FIR) low-pass filter. In another specific embodiment, the interpolation filter may be an infinite impulse response (IIR) filter. The upsampling module 118 provides the upsampled digital signal 117 to the noise shaper module 120.

The noise shaper module 120 may receive the upsampled digital signal 117 and may covert the upsampled digital signal 117 to an appropriate bit depth based on the frame size signal 126. In a particular embodiment, the noise shaper module 120 may operate as a variable, fractional, multi-bit noise shaper. The noise shaper module 120 provides a noise shaped signal output 128 to the PWM 104.

The PWM 104 may receive the noise shaped signal 128 and generate a pulse width modulated signal output 105 based on the frame size signal 126. In a particular embodiment, the PWM 104 may periodically vary a frame size based on the pulse width modulation frame size and sample rate of the digital input signal 114. In a particular embodiment, the PWM 104 may also periodically slip a frame to re-align with the sample rate of the digital input signal 114. In a specific embodiment, the PWM 104 can slip every eighth frame to re-align a pulse width modulation signal output 105 with the sample rate of the digital input signal 114. The PWM 104 may provide the pulse width modulated signal output 105 to the power stage 106.

In a particular embodiment, the power stage 106 may include a switching amplifier to amplify the pulse width modulated signal output 105. In a particular embodiment, the power stage 106 may include a 3-state switching arrangement (SW) 142 driven by a 3-state switching arrangement control circuit (CC) 140. In a specific embodiment, the control circuit 140 may include an H-bridge driver. In a particular embodiment, the output 107 of the power stage may be coupled to a digital load or an analog load. In a particular embodiment, the digital input signal 114 may be an audio signal and the power stage 106 may be coupled to an audio speaker via an output filter.

The switching amplifier system 100 may operate at a master clock frequency to process the received digital signal 114 that has a sample rate that is unsynchronized with the master clock 108. Furthermore, because the switching amplifier system 100 does not use a sample rate converter to synchronize the input signal 114 to an output frequency of the PWM 104, the switching amplifier system 100 may have a smaller device area of an integrated circuit, and thus a reduced cost of manufacture, than systems that use sample rate converters.

Figure 2:
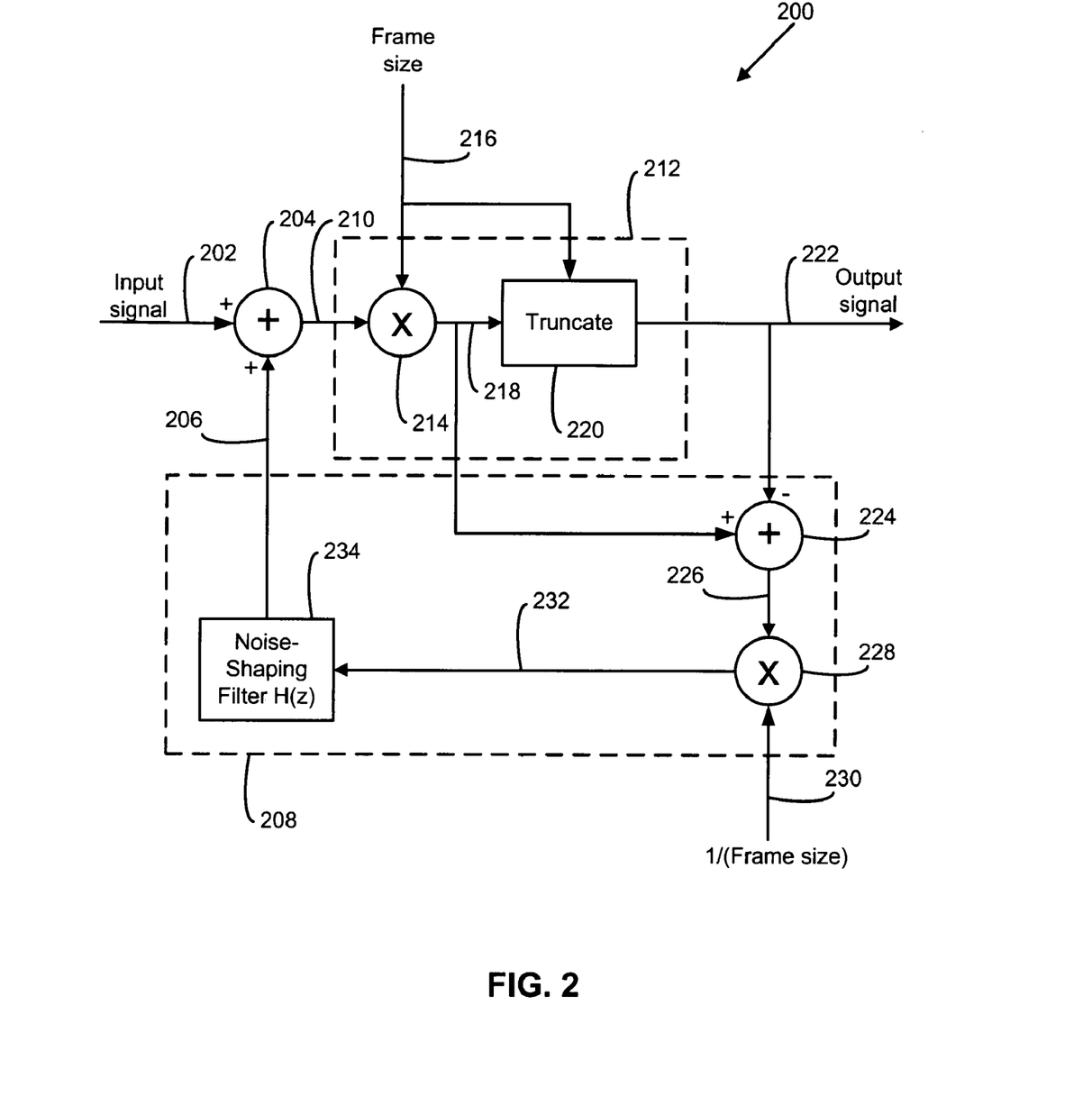
FIG. 2 is a block diagram of a particular illustrative embodiment of a digital signal processing device for use in connection with a switching amplifier system.

Referring to FIG. 2, a particular illustrative embodiment of a digital signal processing (DSP) device for use in connection with a switching amplifier system is depicted and generally designated 200. The DSP device 200 includes an input signal 202 to a first summing unit 204. The first summing unit 204 is coupled to a feedback stage 208 and a multiplier stage 212. The multiplier stage 212 includes a first multiplier unit 214 coupled to a truncation device 220. The feedback stage 208 includes a second summing unit 224 coupled to a second multiplier unit 228. The second multiplier unit 228 is coupled to a noise-shaping filter 234.

During operation, the first summing unit 204 may include logic that adds a feedback signal output 206 to the input signal 202 to generate a first summing signal output 210. In a particular embodiment, the feedback signal 206 may provide an offset value that at least partially corrects for a truncation error of a prior value of the input signal 202. The first summing signal 210 is sent to the multiplier stage 212.

The multiplier stage 212 may receive the first summing signal 210 at the first multiplier unit 214. The first multiplier unit 214 may include logic to multiply the first summing signal 210 to a frame size signal input 216 to produce a first multiplier signal output 218 that has an increased bit depth than the input signal 202. In a particular embodiment, the frame size signal 216 may be pulse width modulation frame size data that is received from a device that determines a frame size based on a sample rate of a digital input signal. The first multiplier signal output 218 is sent to the truncation device 220.

The truncation device 220 receives the first multiplier signal 218 and the frame size signal 216. The truncation device 220 may include logic to truncate the first multiplier signal 218 and to generate an output signal 222.

The feedback stage 208 may receive the output signal 222 at an inverting input of the second summing unit 224 and may also receive the first multiplier signal 218 at a non-inverting output of the second summing unit 224. The second summing unit 224 may include logic to subtract the output signal 222 from the first multiplier signal 218 and output a second summing signal output 226. The second summing signal 226 may represent a truncation error of the output signal 222 that is introduced by the truncation device 220.

The second multiplier unit 228 may receive the second summing signal 226 and may contain logic to multiply the second summing signal 226 with a 1/(frame size) signal input 230. The 1/(frame size) signal 226 may represent a reciprocal value of the frame size signal 216. The second multiplier 228 may generate a second multiplier signal output 232 that may represent a reduction of the truncation error to the bit depth of the input signal 202.

The second multiplier signal 232 is received at the noise-shaping filter 234. The noise-shaping filter 234 may include logic to filter the second multiplier signal 232 to produce the noise-shaped feedback signal 206. In a particular embodiment, the noise-shaping filter 234 may include a low-pass filter. In a specific embodiment, the noise-shaping filter 234 includes a finite-impulse response (FIR) filter.

In a particular embodiment, the device 200 may operate as a noise-shaping device that increases a bit-depth of the input signal 202 based on the frame size signal 216. The device 200 may also compensate for truncation errors due to the frame-size signal 216 via the feedback loop 208. Thus, the device 200 may function to noise-shape a digital input signal to generate a noise shaper output signal to a pulse-width modulator (PWM) that may or may not be synchronized with the digital input signal.

Figure 3:
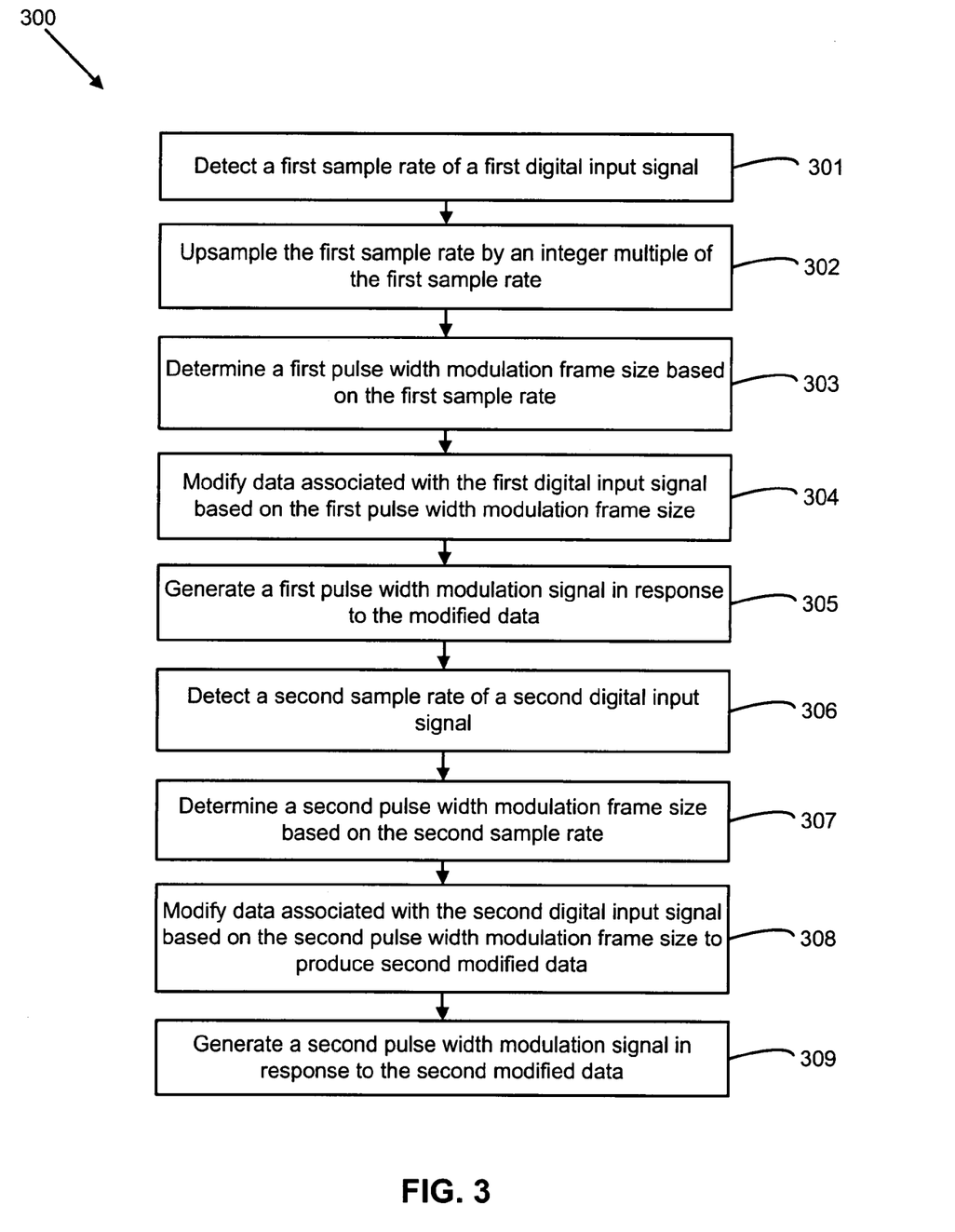
FIG. 3 is a flow diagram of a particular illustrative embodiment of a method of processing a digital signal in a switching amplifier system.

Referring to FIG. 3 a particular illustrative embodiment of a method of processing a digital signal in a switching amplifier system is depicted and generally designated 300. A first sample rate of a first digital input signal is detected, at 301. In a particular embodiment, the first digital input signal may be a digital audio signal, such as an audio signal from a compact disc (CD), digital audio tape (DAT), or digital video disc (DVD), that contains digital audio data. In a specific embodiment, the first digital input signal is a CD signal and the first sample rate is approximately 44.1 kHz. In a specific embodiment, the first sample rate may be detected at a sample rate detection device, such as the sample rate detection module 122.

In a particular embodiment, the first sample rate is upsampled by an integer multiple of the first sample rate, at 302. In a particular embodiment, the integer multiple reflects an upsampling ratio that is defined as the ratio of the sample rate of the upsampled digital input signal to the sample rate of the original digital input signal. In a specific embodiment, the upsampling ratio is eight.

A first pulse width modulation frame size is determined based on the first sample rate, at 303. In a particular embodiment, the first pulse width modulation frame size may be determined by dividing a master clock rate that a pulse-width modulator (PWM) operates at by a multiplicative product of the first sample rate and the upsampling ratio. In a particular embodiment, the first pulse width modulation frame size may be determined by a frame size device, such as the frame size module 124.

Data associated with the first digital input signal is modified based on the first pulse width modulation frame size, at 304. In a particular embodiment, a bit depth of the first digital input signal may be increased by multiplying the upsampled digital signal by the first pulse width modulation frame size. In a particular embodiment, the upsampled signal may be modified by a noise-shaper device, such as the noise-shaper module 120, to distribute noise generated by processing components to non-audio frequencies.

A first pulse width modulation signal is generated in response to the modified data, at 305. In a particular embodiment, the first pulse width modulation signal may be generated at a PWM that operates at a master clock rate that is not synchronized with the first digital input signal, such as the PWM 104.

In a particular embodiment, a second sample rate of a second digital input signal is detected, at 306. In a particular embodiment, the second sample rate may be different than the first sample rate. In a specific embodiment, the second digital input signal may be a DAT or DVD signal, and the second sample rate may be approximately 48 kHz.

In a particular embodiment, a second pulse width modulation frame size is determined based on the second sample rate, at 307. In a particular embodiment, the second digital input signal is upsampled at the upsampling ratio, and the second pulse width modulation frame size may be determined by dividing the master clock rate by a multiplicative product of the second sample rate and the upsampling ratio. In a particular embodiment, the second pulse width modulation frame size may be determined by a frame size device, such as the frame size module 124.

In a particular embodiment, data associated with the second digital input signal is modified based on the second pulse width modulation frame size to produce second modified data, at 308. In a particular embodiment, a bit depth of the second digital input signal may be increased by upsampling the second digital signal and multiplying the upsampled second digital signal by the second pulse width modulation frame size. In a particular embodiment, the upsampled second digital signal may be modified by a noise-shaper device, such as the noise-shaper module 120, to distribute noise generated by processing components to non-audio frequencies.

In a particular embodiment, a second pulse width modulation signal is generated in response to the second modified data, at 309. In a particular embodiment, the second pulse width modulation signal may be generated at a PWM that operates at a master clock rate that is not synchronized with the second digital input signal, such as the PWM 104.

Figure 4:
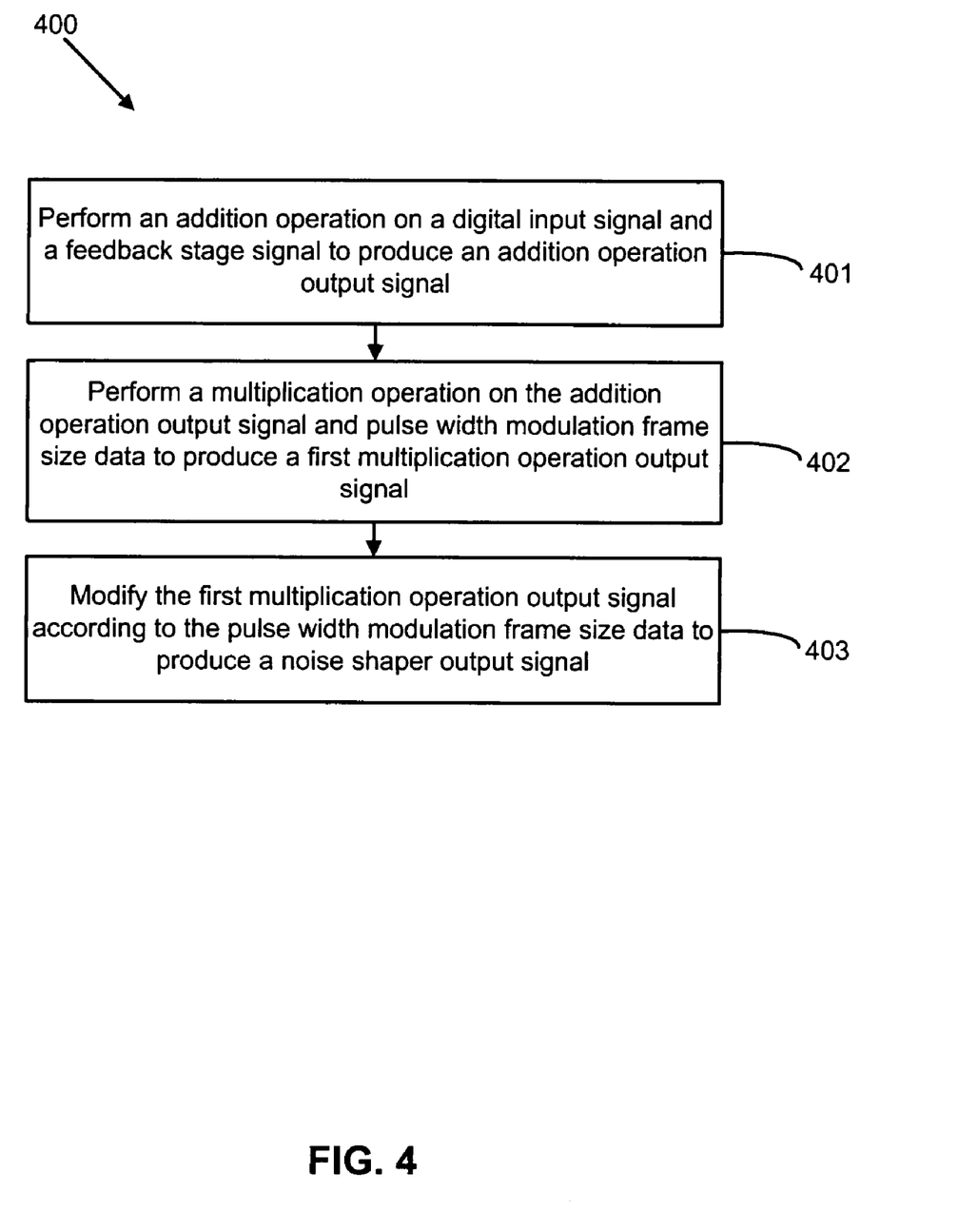
FIG. 4 is a flow diagram of another illustrative embodiment of a method of processing a digital signal in a switching amplifier system.

Referring to FIG. 4, an illustrative embodiment of a method of processing a digital signal in a switching amplifier system is depicted and generally designated 400. An addition operation is performed on a digital input signal and a feedback stage signal to produce an addition operation output signal, at 401. In a particular embodiment, the feedback stage signal may at least partially compensate for a truncation error in an output signal, such as the feedback signal 206 of the feedback stage 208.

A multiplication operation is performed on the addition operation output signal and pulse width modulation frame size data to produce a first multiplication operation output signal, at 402. In a particular embodiment, the multiplication operation increases a bit depth of the digital input signal to correspond to a frame size for a pulse-width modulator (PWM) that is not synchronized with the digital input signal, such as the PWM 104.

The first multiplication operation output signal is modified according to the pulse width modulation frame size data to produce a noise shaper output signal, at 403. In a particular embodiment, modifying the first multiplication operation output signal may include a truncation operation that is performed to reduce a number of bits associated with the first multiplication operation output signal, such as performed by the truncation device 220.

Figure 5:
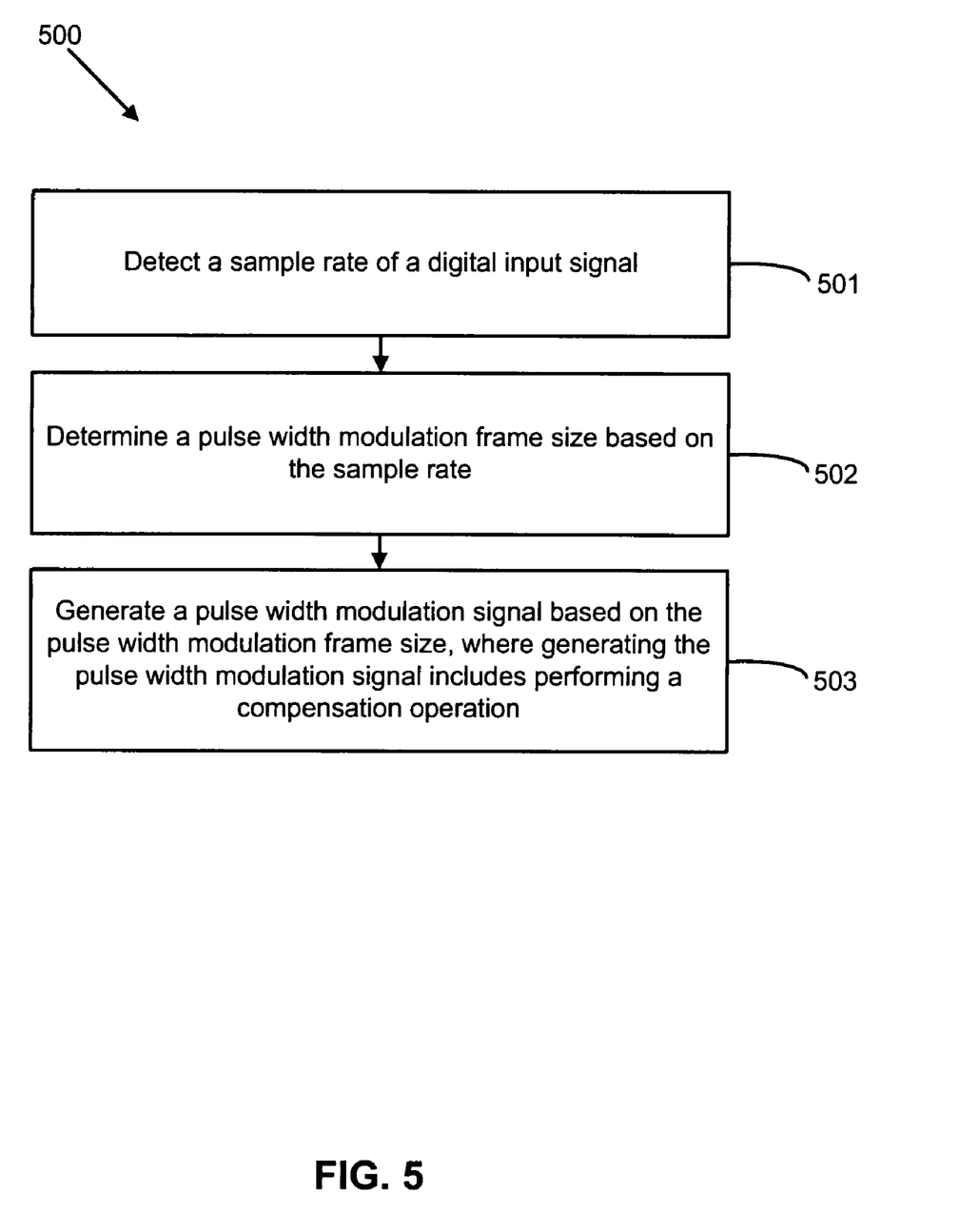
FIG. 5 is a flow diagram of another illustrative embodiment of a method of processing a digital signal in a switching amplifier system.

Referring to FIG. 5, an illustrative embodiment of a method of processing a digital signal in a switching amplifier system is depicted and generally designated 500. A sample rate of a digital input signal is detected, at 501. In a specific embodiment, the sample rate may be determined by a sample rate detection module, such as the sample rate detection module 122.

A pulse width modulation frame size is determined based on the sample rate, at 502. A pulse width modulation signal is generated based on the pulse width modulation frame size, at 503. In a particular embodiment, the pulse width modulation signal may be generated by a pulse-width modulator (PWM) that is not synchronized with the digital input signal, such as the PWM 104.

In a specific embodiment, the pulse-width modulation signal may lose alignment with the sample rate of the digital input signal due to truncation errors. The truncation errors may arise from a non-integer pulse width modulation frame size. The pulse width modulation frame size may be determined at least partially based on the ratio of the pulse width modulation signal to the sample rate.

A compensation operation is therefore performed as part of generating the pulse width modulation signal. In a particular embodiment, the compensation operation includes re-aligning data associated with a particular frame of input data to a pulse width modulator (PWM), such as the PWM 104. In a particular embodiment, the pulse width modulation signal may periodically re-align with the sample rate of the digital input signal. In a particular embodiment, the frame re-alignment may be based at least partially on the pulse width modulation frame size and the sample rate.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above-disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A switching amplifier system, comprising:
 a sample rate detection module to detect a sample rate of a digital input signal;
 a frame size module to determine a pulse width modulation frame size based on the sample rate of the digital input signal;
 an upsampling module to modify data associated with the digital input signal, the upsampling module to produce an upsampled digital input signal;
 a noise shaper module to modify the upsampled digital input signal based on the pulse width modulation frame size to produce a noise shaper output signal; and
 a pulse width modulation device responsive to the noise shaper output signal.

2. The system of claim 1, wherein the pulse width modulation device is responsive to a master clock operating at a fixed rate.

3. The system of claim 1, wherein the digital input signal is a digital audio signal.

4. The system of claim 1, further comprising a power stage responsive to the pulse width modulation device.

5. The system of claim 4, wherein the power stage comprises a 3-state switching arrangement and a 3-state switching arrangement control circuit.

6. The system of claim 5, wherein the 3-state switching arrangement control circuit is an H-Bridge driver.

7. A method for processing a digital signal, the method comprising:
 detecting a first sample rate of a first digital input signal;
 determining a first pulse width modulation frame size based on the first sample rate;
 modifying data associated with the first digital input signal based on the first pulse width modulation frame size; and
 generating a first pulse width modulation signal in response to the modified data.

8. The method of claim 7, further comprising:
 detecting a second sample rate of a second digital input signal; and
 determining a second pulse width modulation frame size based on the second sample rate.

9. The method of claim 8, further comprising:
 modifying data associated with the second digital input signal based on the second pulse width modulation frame size to produce second modified data; and
 generating a second pulse width modulation signal in response to the second modified data.

10. The method of claim 8, wherein the first sample rate of the first digital input signal is different from the second sample rate of the second digital input signal.

11. The method of claim 7, further comprising upsampling the first sample rate by an integer multiple of the first sample rate.

12. The method of claim 7, wherein determining the first pulse width modulation frame size includes performing a calculation with a master clock rate, the first sample rate, and an upsampling ratio.

13. A digital signal processing device for use in connection with a switching amplifier system, the device comprising:
 a first summing unit responsive to a digital input signal; and
 a multiplier stage responsive to the first summing unit and to a pulse width modulation frame size data, the multiplier stage having an output to provide a noise shaper output signal.

14. The device of claim 13, wherein the multiplier stage includes a first multiplier unit and a truncation unit.

15. The device of claim 14, wherein the first multiplier unit is responsive to the first summing unit and the pulse width modulation frame size data.

16. The device of claim 14, wherein the truncation unit is responsive to the first multiplier unit and the pulse width modulation frame size data.

17. The device of claim 14, further comprising a feedback stage coupled to the multiplier stage.

18. The device of claim 17, wherein the feedback stage comprises a second summing unit and a second multiplier unit.

19. The device of claim 18, wherein the second multiplier unit is responsive to a pulse width modulation frame size reciprocal signal.

20. The device of claim 19, wherein the feedback stage comprises a low-pass filter that is responsive to the second multiplier unit.

21. The device of claim 18, wherein the second summing unit is responsive to the first multiplier unit and the noise shaper output signal.

22. A method for processing a digital signal, the method comprising:
 performing an addition operation on a digital input signal and a feedback stage signal to produce an addition operation output signal;
 performing a multiplication operation on the addition operation output signal and pulse width modulation frame size data to produce a first multiplication operation output signal; and
 modifying the first multiplication operation output signal according to the pulse width modulation frame size data to produce a noise shaper output signal.

23. The method of claim 22, wherein modifying the first multiplication operation output signal comprises performing a truncation operation to reduce the number of bits associated with the first multiplication operation output signal.

24. A method for processing a digital signal, the method comprising:

detecting a sample rate of a digital input signal;

determining a pulse width modulation frame size based on the sample rate; and     generating a pulse width modulation signal based on the pulse width modulation frame size;

wherein generating the pulse width modulation signal comprises performing a compensation operation.

25. The method of claim 24, wherein the compensation operation comprises re-aligning data associated with a particular frame.

26. The method of claim 24, wherein the compensation operation is performed periodically.

27. The method of claim 24, wherein the compensation operation is performed based on the sample rate.

28. The method of claim 24, wherein the compensation operation is performed based on the pulse width modulation frame size.

* * * * *